United States Patent [19]

Schoch, Jr. et al.

[11] Patent Number: 5,250,388
[45] Date of Patent: Oct. 5, 1993

[54] PRODUCTION OF HIGHLY CONDUCTIVE POLYMERS FOR ELECTRONIC CIRCUITS

[75] Inventors: Karl F. Schoch, Jr., Penn Hills; John Bartko, Monroeville; Maurice H. Hanes, Murrysville; Francis H. Ruddy, Monroeville, all of Pa.

[73] Assignee: Westinghouse Electric Corp., Pittsburgh, Pa.

[21] Appl. No.: 200,331

[22] Filed: May 31, 1988

[51] Int. Cl.$^5$ .................... G03C 5/00; H01L 21/04
[52] U.S. Cl. .................... 430/269; 430/311; 430/312; 430/313; 430/314; 430/317; 430/322; 430/323; 430/324; 430/327; 430/394; 204/157.63; 250/492.2; 250/492.3; 156/628; 156/643; 156/659.1; 437/15; 437/16; 437/20; 437/229
[58] Field of Search ............ 430/296, 311, 312, 313, 430/314, 317, 322, 323, 324, 327, 328, 329, 394, 60, 269.4; 204/197.63, 157.65, 192.34; 250/492.2, 492.3; 156/643, 627, 628, 659.1, 661.2, 668; 437/15, 16, 18, 20, 21, 22, 228, 229, 930; 427/35, 43.1; 428/458, 212, 474.7

[56] References Cited

U.S. PATENT DOCUMENTS

| | | | |
|---|---|---|---|
| 3,953,877 | 4/1976 | Sigusch et al. | 357/72 |
| 4,229,502 | 10/1980 | Wu et al. | 437/16 |
| 4,339,521 | 7/1982 | Ahne et al. | 430/192 |
| 4,377,437 | 3/1983 | Taylor et al. | 156/628 |
| 4,395,482 | 7/1983 | Ahne et al. | 430/326 |
| 4,426,247 | 1/1984 | Tamamura et al. | 156/643 |
| 4,452,644 | 6/1984 | Bruel et al. | 437/16 |
| 4,499,008 | 2/1985 | Wellinghoff | 524/80 |
| 4,500,362 | 2/1985 | Mori | 148/1.5 |
| 4,500,365 | 2/1985 | Mori | 148/1.5 |
| 4,568,482 | 2/1986 | Jenekhe | 524/80 |
| 4,705,729 | 11/1987 | Sheats | 430/5 |
| 4,835,118 | 5/1989 | Jones et al. | 437/16 |
| 4,847,216 | 7/1989 | d'Avitaya et al. | 437/105 |

FOREIGN PATENT DOCUMENTS 0058566 8/1982 European Pat. Off. .............. 437/16

OTHER PUBLICATIONS

"Ion Implantation of Poly (Para-Phenylene): Stability of the Resulting Electrical Conductivity and Influence of Implantation Parameters" By Duroux et al. and appearing in the Makromol. Chem., Macromol. Symp. 24, 163–167 (1989).
Article entitled, "Electrical Properties of Ion-Implanted Polyacetylene Films," by Koshida and Suzuki, Jun. 15, 1987 Issue, Journal of Applied Physics, (5487–5488).
Article entitled, "Ion Implantation of Poly (P-Phenylene Chalcogenides)," By Wasserman, Dresselhaus and Whek, Aug., 1984, Polymer reprints, vol. 25, (286).
Defensive Publication Entitled, "Aromatic Polymers Containing A Conductive Filler," By Staniland, Published Nov. 7, 1972, 904 O.G. 8.

Primary Examiner—Donald J. Loney
Attorney, Agent, or Firm—M. P. Lynch

[57] ABSTRACT

Processes for producing stable, radiation hard, highly conductive polymers by a combination of chemical doping and ion irradiation and microelectronics are described. The highly conductive polymers formed by these processes may contain regions of different kinds of conductivity on the same polymer. Resist coatings and masks are used in conjunction with chemical doping and ion irradiation to create specific predetermined n and p conductivity patterns and insulation areas on polymeric films of selected thicknesses for electronic circuitry applications. The resulting circuitry, besides having a conductivity approaching that of metal, is extremely light in weight, flexible, and conductively stable. Several different configurations of microelectronic junction devices fabricated from single type or multiple type conductivity polymer films used either alone or with a polymer of opposite conductivity and a suitable metal or metals are disclosed.

31 Claims, 2 Drawing Sheets

PRODUCTION OF HIGHLY CONDUCTIVE POLYMERS FOR ELECTRONIC CIRCUITS

BACKGROUND OF THE INVENTION

The present invention relates generally to the production of conductive polymers and in particular, to the production of highly conductive polymers having selectively located n and p regions produced by ion irradiation to facilitate the fabrication of microelectronic circuitry on the polymers.

The growing interest in the industrial exploitation of outer space has created a demand for microelectronic components that are both light weight and tolerant of relatively high radiation levels. Certain military applications also require light weight, radiation-resistant microelectronic components. While semiconductor microelectronic components made from gallium arsenide are known which can withstand between $10^8$ to $10^9$ rads, these components are relatively heavy and hence expensive to transport to space While light weight microelectronic components formed from conductive polymers are also known, the resulting components are generally unstable when exposed to normal levels of oxygen and to significant levels of radiation.

The use of conductive polymers in the fabrication of microelectronic circuitry initially appeared promising. Circuit devices made from such polymers are not only light weight; the costs of the polymeric materials are significantly less than the cost of more conventional semiconductor materials. In addition, polymeric films are flexible and permit the fabrication of large sections of circuitry with relative ease. However, each of the currently available methods for making polymeric films conductive has its shortcomings.

One such available method for producing a conductive polymer involves chemically doping the polymer with a suitable oxidizing or reducing agent. This technique not only increases the conductivity of the polymer, but it also determines whether the type of conductivity will be p or n. Unfortunately, the resulting conductivity is not stable, and when a chemically doped conductive polymer produced according to this method is exposed to the oxygen and moisture present in air, the conductivity decreases with time. After a period of time, the polymer may no longer be capable of functioning as required in an electronic circuit. For example, polyacetylene, a polymer that is both highly conductive and easy to prepare, reacts so quickly with ambient oxygen that the deterioration of its conductive properties becomes evident after just ten minutes exposure to air.

In another method, highly conductive polymers are made by irradiating the polymers with ions. Although these polymers are both highly conductive and stable, their utility in electronic circuit applications is limited by the fact that the type of conductivity (p or n) that is ion-produced is specific to each polymer. Hence, the entire polymer has only a single type of conductivity after irradiation. Consequently, two polymer types, one of which has p conductivity and the other of which has n conductivity after ion irradiation, are required to fabricate an electronic circuit. This requirement increases the number and complexity of the processing steps needed and hence the cost of the circuitry. Moreover, this technique cannot be used to selectively vary the conductivity of the polymer to the extent required to produce a microelectronic circuit material capable of functioning at the speeds many current applications require.

While it should be possible to produce polymers with predetermined p or n conductivity patterns by implanting appropriate ions at locations on the polymer where the particular type of conductivity is desired, this method would be extremely expensive and time consuming. The ion doses required to achieve these results would be impractical with the currently available accelerators. Further, the high ion dose rates necessary to produce this selective conductivity could result in destruction of the polymer unless special provisions were made for cooling the polymer, which would add additional processing steps.

Accordingly, there is presently a great need for a method that employs relatively simple processing steps to produce, at low cost, a highly conductive, stable polymer having both n and p conducting regions that is sufficiently light in weight and radiation hardened to be useful in space applications.

SUMMARY OF THE INVENTION

The present invention provides methods for producing a highly conductive, stable polymer wherein both p and n conducting regions are selectively created in predetermined regions on a single polymer. Such polymers are especially suitable for use in the fabrication of microelectronic circuits where light weight, flexibility, low cost and rapid functioning of the circuit are required.

According to the primary embodiment of the present invention, a suitable polymer of an appropriate thickness is selected and chemically doped by exposure, in the absence of oxygen, to a dopant selected to produce the opposite type of conductivity from that produced by ion irradiation in the polymer. The chemically doped polymer is then irradiated, still in the absence of oxygen, by an ion accelerator beam, which produces a very stable polymeric species. Various techniques can then be employed to produce, in whatever predetermined patterns desired, regions of p or n conductivity. Polymer electronic circuits having stable characteristics can be produced easily and at low cost according to this method.

Polymer electronic circuits produced according to the present method can be effectively used to form a variety of different kinds of microelectronic junction devices, such as a Schottky barrier, a p/n junction, a field effect transistor (FET), and different configurations of n/p/n junctions.

BRIEF DESCRIPTION OF THE SEVERAL FIGURES

DETAILED DESCRIPTION OF THE PREFERRED EMBODIMENT

General Overview Of The Process

Figure 1:
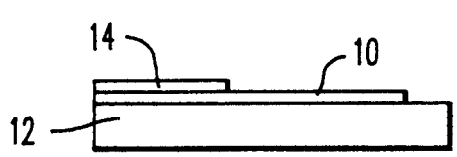
FIG. 1 is a diagrammatic representation of a Schottky barrier formed with the conductive polymers of the present invention.

When polymers are irradiated by high energy ions, they exhibit a significant increase in conductivity which is stable under ambient conditions. The type of conductivity produced by ion irradiation, p or n, generally depends on the polymer. The present invention demonstrates that it is possible to produce a stable polymer with the opposite type of conductivity by chemically doping a selected polymer of a selected film thickness and then ion irradiating the chemically doped polymer. Polymer films treated as described were found to demonstrate only a very slight increase in resistance upon exposure to air when compared with the significant resistance increases characteristic of an unirradiated doped polymer film.

Although the exact mechanism which achieves this exceptional stability is not precisely known, it is thought to be related to the processes involved in the dissipation of energy in solids by energetic ions. These ions lose energy primarily by ionization processes which result in the formation of energetic electrons or delta rays. The delta rays in turn lose energy by ionization processes that produce secondary electrons. The region within the radius of 50 to 100 Angstrom units of the irradiating ion's trajectory is subjected to intense ionization and creates scission of the polymer chain, free radical formation and gas (primarily hydrogen) formation. A sufficient dose of ions results in increased conductivity in even a nonconducting polymer.

Processes similar to those that produce charge carriers resulting from ion irradiation may be assumed to account for the stabilization effect of ion irradiation on chemically doped conducting polymers. It is possible that one or more of the complex chemical species formed by ion irradiation may react chemically with the dopant species to render the polymer less susceptible to the effects of oxidation. If this is the case and if the reactive species produced by ion irradiation are not mobile within the polymer, stability of the doped polymer will depend on irradiating the polymer with a sufficient dose of ions to insure that the probability of reactions with the dopant species will be high. Therefore, the degree of stabilization of the doped, irradiated polymer should be dependent on the dose of irradiating ions up to a saturation value. In addition, this degree of stabilization should exhibit a clear threshold value such as that observed for conducting polymers produced by ion irradiation alone. The energy of the ions used to irradiate polymers as described herein is represented by the value of dE/dx for each kind of ion used. Generally, the energy of the ions used in the process described herein is higher than that commonly employed to produce organic materials with the highest conductivity for a given dose. The foregoing theory is presented solely for purposes of explaining the results achieved by the present invention as currently understood. However, applicants do not intend to be limited to any one specific theory.

Specific Description Of The Process

Applicants have developed several specific techniques employing the basic concept described above to produce both p and n conducting regions on a single polymer which creates a stable, highly conductive polymer suitable for use in an electronic circuit. These techniques have adapted process steps currently used in the fabrication of electronic circuits. Therefore, the production of circuit components from the novel conductive polymers produced as described herein can be achieved at no greater cost than is encountered in the production of electronic circuits from previously available materials. However, since the cost of the conductive polymers is lower than the cost of semiconductors and other known electronic circuit materials, the ultimate cost of an electronic circuit made according to the present invention is lower.

One process that may be employed to produce a stable, highly conductive polymer having both p and n conductive regions is preferred because of its simplicity and low cost and the ease with which it may be conducted. However, this technique can only be employed if the ion irradiation dose required to produce one type of conductivity in the undoped polymer will not convert the conductivity of the doped polymer to the same conductivity as that of the irradiated undoped polymer. Otherwise, the entire polymer will have the same kind of conductivity rather than discrete p and n conductivity regions as desired. To illustrate, the irradiation of polyacetylene produces n-type conductivity. Regions having p-type conductivity can be produced in the polyacetylene by chemically doping it with a suitable dopant according to a predetermined pattern, preferably using a mask, and the polyacetylene is irradiated with a dose of ions high enough to produce n-type conductivity in the undoped regions while stabilizing the doped p regions. If the ion irradiation dose is too high, the doped p regions will be changed to n-type conductivity. Therefore, the ion dose applied to the polymer by irradiation must be carefully selected.

According to this technique, polyacetylene (PA), which, as previously noted, has n conductivity when irradiated, may be doped with iodine through a suitable mask to produce regions of p conductivity where the iodine is allowed to contact the polyacetylene. Regions of the polymer that will act as insulation areas to isolate one conductive region of the polymer from another are then coated with a thick coating of a resist material such as polymethylmethacrylate (PMMA) through another mask. The doped, coated polymer is then irradiated with ions to produce simultaneously both p and n conductive regions. The doped region will have p type of conductivity, the undoped, unshielded regions will have n type of conductivity, and the shielded regions will be substantially nonconductive.

The foregoing process is preferably conducted at least partially in an inert atmosphere, such as in nitrogen or argon gas, and at least partially in a vacuum. The absence of oxygen is required to prevent deterioration of the doped polymer until it can be stabilized by irradiation, which takes place in a vacuum.

The configurations of the masks used to create the locations of the p and n conductive regions and the insulation areas will depend on the type of electronic circuit to be created. The precise locations of these regions can be predetermined and produced in any desired pattern by the foregoing technique.

Many different organic polymers can be rendered conductive according to the present invention. The following list of polymers, which is not intended to be an exhaustive one, is exemplary of polymers other than polyacetylene that are suitable for chemical doping and ion irradiation in accordance with the methods described herein:
polypyrrole
polythiophene
polyaniline
polyacrylonitrile
polyethylene
polyphenylene sulfide
polyimide
polyamide-imide The specific chemical dopant selected for use with the present process will depend on the type of conductivity of the polymer after irradiation. A polymer, such as polyacetylene, that has n-type of conductivity after irradiation will require a p-type dopant. Conversely, a polymer, such as polyphenylene sulfide, that has p-type of conductivity after irradiation will require a dopant that is n-type. Examples of p-type dopants include arsenic pentafluoride, fluorine, bromine, iodine, ferric chloride, sulfur trioxide, dicyanodichloro-p-benzoquinone, and iodine. Exemplary of n-type dopants are the alkali metals, such as sodium, lithium and potassium. Polyamide-imide doped and ion irradiated as described herein is stable to $10^8$ to $10^9$ rads, which gives it a radiation hardness equivalent to that of gallium arsenide in addition to the advantages of light weight, flexibility and ease of fabrication characteristic of organic polymeric materials.

The polymer selected for use in the present process, whether polyamide-imide, polyacetylene, polyphenylene sulfide (PPS), polyacrylonitrile (PAN) or another suitable polymeric material, is preferably employed in the form of a film. Several methods of forming such polymer films are well known. It has been discovered that not all polymeric films are able to withstand the stresses imposed by ion irradiation. A polymeric film that is too thin can become very brittle after ion irradiation, and will then crumble and disintegrate when further processing is attempted. Some polymeric films having thicknesses less than or equal to 20 microns will be able to withstand the stresses accompanying ion irradiation at the required dosages to achieve the conductivity desired. Others will be particularly susceptible to disintegration following irradiation at this thickness.

Thin polyethylene films ion irradiated with $10^{10}$ to $10^{12}$ rads will disintegrate following irradiation. This is not surprising since it is well known that polyethylene becomes embrittled at $10^8$ rads. However, ion irradiation of ¼ inch (6350 microns) thick samples of polyethylene produced a thin (1 micron) silvery black layer, which was not brittle, on the surface. It is hypothesized that the bulk of the material below this thin layer effectively dissipated the thermal and mechanical stresses created by ion irradiation.

Polyacrylonitrile (PAN) films 25 microns and less in thickness are typically destroyed by ion irradiation. Significantly thicker PAN films having thicknesses of 177.9 microns, 378.7 microns, 623 microns and 686 microns were irradiated with 100 KeV argon (Ar) ions at a dose of $5 \times 10^{15}$ ions/cm². The integrity of each sample was tested by applying pressure to the film with a pointed object. The three PAN films thicker than 177.9 microns did not change in response to the application of pressure. The film that was 177.9 microns thick, however, cracked in response to slight pressure from a pointed object. This thickness, 177.9 microns, therefore, is on the borderline of acceptability for PAN films. The polymeric material selected for use in the present process, therefore, will require evaluation, prior to its use to mass produce a stable conductive film, to determine the optimum thickness limits of the film for the dose of ion irradiation to be applied. If the optimum film thickness limits are not ascertained prior to ion irradiation, the irradiated film may not be stable enough to be useful. Consequently, the selection of a polymeric film sufficiently thick to withstand the dosage of ion irradiation required to produce the desired conductivity is a crucial first step in the present invention.

PMMA is preferred as a resist coating for the insulation regions of the polyacetylene polymer. Other resists, such as platinum boron sulfide (PtBS), polyvinyl chloride (PVC), polymethlvinyl ketone (PMVK), polyvinyl alcohol (PVA), and those listed in the March, 1979 Hughes Research Lab publication "Focused Ion Beam Technology," No. N00123-78-C-0195, could also be used, depending upon the polymer chosen to form the film. The resist coating must be thick enough to prevent the irradiating ions from penetrating the coating and affecting the conductivity of the underlying polymer. The polymer regions covered by the resist coating according to this technique must remain nonconductive. Consequently, the thickness of the coating will depend upon the characteristics of the irradiating ion and the energy of the irradiating ion. Generally, however, a coating thickness in the range of about 5 to 20 microns will prevent the penetration of ions through the coating.

As previously noted, masks are employed to create predetermined patterns of p and n conductivity during chemical doping of the polymer and during ion irradiation. The use of masks is well known in the electronic circuit art. The masks that can be effectively used to create the desired patterns of conductivity on the polymers of the present invention can generally be formed from any organic material that can also be used as a semiconductor mask material as long as the mask "bonds" to the polymer and can then be etched off or otherwise removed. The specific mask material chosen will depend on the base polymer used. Many of the same materials that can be used to form resist coatings could also be used to form masks. The thickness of the mask, moreover, must be that required to prevent the irradiating ions from penetrating it to reach the underlying polymer.

A second method of producing polymers having a predetermined pattern of regions of different conductivity and regions of nonconductivity uses ion beam lithographic techniques. High intensity, low energy ion accelerators are employed to "write" the desired patterns on photoresist material and to "write" n and p regions on the polymer. It is first necessary to irradiate the n regions of the polymer with high intensity beams to produce the required conductivity while the polymer is in a vacuum. The entire polymer sample is then doped with iodine in an inert atmosphere, and the p regions are written with the ion beam, thereby fixing the dopant. When the polymer is then exposed to air, only the p and n regions will remain.

A third process uses the relationship between free radical production in the polymer and the rate of ion energy deposition dE/dx. As with the processes previously discussed, most of these process steps are conducted in a vacuum. The steps include first chemically doping the p regions in an inert atmosphere using a suitable mask as discussed above. Then, using the same mask, a thin coating of etchable material is deposited over the doped region. A thick coating, such as that discussed above in the first technique, is applied to the remainder of the polymer with the exception of the n regions, which are uncovered. The polymer is then irradiated, and the coatings are etched off.

Experimental data produced by the inventors indicates that irradiations with 25 MeV and 50 MeV iodine ions (dE/dx about 34.5 and 51 MeV/mg/cm$^2$, respectively) produces conductivities in polyphenylene sulfide (PPS) that differ by about two orders of magnitude for a given dose. The dE/dx values used in the ion irradiation processes described herein will depend on several factors, including the type of ion and the energy of the ion used to irradiate the polymer. The dE/dx value must be high enough to change the conductivity of the polymer being irradiated without overcoming the chemical doping to change the conductivity of the doped areas of the polymer. It has been determined, however, that dE/dx should not be lower than about 100 KeV/mg/cm$^2$ for ions of elements having an atomic weight equal to or greater than that of fluorine (F) and should preferably not be less than about 5 MeV/mg/cm$^2$.

When a thin layer of an etchable material is deposited over a chemically doped p region on a polymer such as polyacetylene, for example, the energy of the incoming ion is reduced so that, for a given ion dose, the dE/dx value is high enough to "fix" the dopant, but is not large enough to convert the region to an n type of conductivity. When polyacetylene is used as the base polymer, a photoresist such as PMMA can be used as the etchable material because polyacetylene is insoluble in common organic solvents. During the ion irradiations, the desired n regions would be bare and would, therefore, be subjected to the maximum dE/dx values for the incoming ion energy. As in the first method discussed above, insulating regions of the polymer would be covered with the etchable material to a depth greater than the ion range in that material. PMMA and similar etchant materials that are soluble in common organic solvents, but that do not have any effect on the polyacetylene or other polymer to be made conductive may be used in this process.

An additional method that can be used to produce a selectively conductive polymer employs a thin polymer wafer, preferably of polyacetylene, as a base polymer. The entire wafer is chemically doped. The n regions and the insulating regions of the wafer are then coated with a thick layer of an etchable material, leaving the p regions uncoated. The thickness of the coating should be sufficient to inhibit the transversal of the irradiating ions through it to the polyacetylene. The doped and coated polymer is subjected to a light dose of high energy ions in a vacuum. This "fixes" the dopant in the p regions. Next, the polymer wafer is removed from the vacuum of the ion beam line, and the etchable coating material is etched off. The resulting material is exposed to the air which destabilizes the portions of the wafer that are not fixed. A second coating is applied to the p regions and insulating regions of the polymer wafer, and the coated wafer is then subjected to a second ion irradiation step. This second irradiation step produces the n regions on the polymer. Finally, the coating is removed, preferably by etching.

A variation of this process involves chemically doping only the desired p regions of the wafer using a suitable mask, rather than chemically doping the entire wafer. This procedure reduces the delay involved for the destabilization. However, masking the wafer so that only the p region is doped is a more complex processing step than doping the entire wafer and could lead to increased processing costs.

Other variations of these four main methods of producing a highly conductive polymer with predetermined patterns of p and n conductivity regions are also contemplated to be within the scope of the present invention. For example, the n conductive regions could be produced first rather than the p regions. The specific materials chosen to form the conductive polymer, mask and/or resist coatings, the chemical dopants and irradiating ions used, and the cost of the process are all factors that could require variations from the basic process steps outlined here.

Connections between the p and n regions created on the polymer by the aforementioned methods can be provided by depositing thin metal layers on polymers that are ion irradiated through a mask. The free radicals formed in the irradiated polymer will form bonds to link the metal to the polymer. The coated insulating nonconductive areas of the polymer do not contain any free radicals because the coating prevents the ion irradiation from reaching them, and, therefore, the metal will not adhere to these areas.

Experiments conducted by the inventors, such as the Example set forth below, have conclusively demonstrated the utility of the present invention.

EXAMPLE

Polyacetylene (PA) was prepared by Ziegler-Natta polymerization of acetylene ($C_2H_2$) gas using a catalyst system consisting of $Al(C_2H_5)_3$ and $Ti(OC_4H_9)_4$ in toluene. Upon completion of the reaction, excess $C_2H_2$ was evacuated from the reactor, and the polyacetylene (PA) polymer film was washed with freshly distilled toluene. All operations on the polymer film were then conducted in the absence of oxygen in an inert nitrogen atmosphere. Doping of the PA film was achieved by exposing it to iodine ($I_2$) vapor overnight at room temperature. Excess $I_2$ was then evacuated for two hours at room temperature and 1.1 um Hg.

Two samples of the iodine-doped polymer film were irradiated with 50 MeV iodine ions at the University of Pittsburgh tandem Van de Graaff accelerator. Sample 1 was irradiated with a dose of $5 \times 10^{13}$ ions/cm$^2$, and Sample 2 was irradiated with a dose of $1 \times 10^{14}$ ions/cm$^2$. Both samples were kept in a nitrogen atmosphere in a glove box following irradiation. Sample 3, a doped, unirradiated PA film, was also placed in the nitrogen atmosphere.

The resistance of the three samples was measured in the nitrogen glove box using a two probe method. The samples were then removed from the nitrogen and exposed to air. Periodic resistance measurements were made. Table 1 below sets out the resistance values obtained for the three samples, normalized to the unexposed resistance, as a function of the time after removal from the nitrogen box. The increase in resistance of irradiated Sample 1 and irradiated Sample 2 is much less than the increase in resistance of unirradiated Sample 3.

TABLE 1

| | R(t)/R(0) After Exposure to Air Iodine-doped Polyacetylene | | |
|---|---|---|---|
| Time | Sample 1 Irradiated $5 \times 10^{13}$ ions/cm$^2$ | Sample 2 Irradiated $1 \times 10^{14}$ ions/cm$^2$ | Sample 3 Unirradiated |
| Before Exposure | 1 | 1 | 1 |
| 6 hrs | | | 2.8 |
| 24 hrs | 2.5 | 3.3 | 30 |
| 48 hrs | | 4.4 | * |
| 115 hrs | 4.5 | 7.4 | * |

*Resistance beyond capability of ohmmeter (20M)

Specific Description Of Microelectric Circuit Devices Made With Conductive Polymers Produced According To The Present Invention Irradiated polymers produced according to the techniques described above are relatively inexpensive to produce and provide a very light weight and flexible material that has conductivity approaching that of many metals currently employed in electronic circuitry. Moreover, microelectronic devices made from such polymers are quite stable and radiation hard. Another important characteristic of the highly conductive polymers produced as described above is that the processes by which they are made are readily reproducible so that a specific conductivity pattern can be duplicated on polymer films subsequently subjected to these irradiation processes.

Conductive polymers made according to the processes described above are particularly suitable for use in fabricating microelectronic junction devices. Conventional implantation techniques can be used to achieve extremely small sizes with these materials.

Some of the possible configurations of microelectronic junction devices that can be fabricated using the highly conductive polymers of the present invention are shown in FIGS. 1-9. The devices illustrated in FIGS. 1-9 are merely illustrative of some of the applications of the highly conductive polymers of the present invention and are not intended to comprise the only possible applications. These conductive polymers can be used in virtually any electronics or microelectronics application that would employ semiconductors as substitutes for the semiconductors. In addition, other metal and polymer combinations that achieve the same functions as those shown in FIGS. 1-9 could also be employed to form these devices.

FIG. 1 illustrates, in diagrammatic view, the microelectronic junction device known as a Schottky barrier. This Schottky barrier is made by depositing a thin film 10 of polyphenylene sulfide (PPS) on a suitable metal substrate 12. The metal substrate 12 is preferably formed from aluminum or indium. The PPS is irradiated by ion irradiation after deposition on the metal substrate, which results in the p conductivity of the polymer and Schottky barrier formation at the interface of the polymer and the metal substrate. A second metal layer 14 overlays a portion of the surface of the polymer film 10 and provides ohmic contact. Metal layer 14, therefore, is preferably formed of gold.

Figure 2:
FIG. 2 is a diagrammatic representation of a p/n junction using conductive polymers produced as described herein.

FIG. 2 illustrates a p/n junction. A layer 20 of a first polymer is deposited on a metal substrate 22. A layer 24 of a second polymer is then deposited on the first layer 20. A second metal layer 26 is placed over the second polymer layer 24. The metal substrate 22 is selected from a metal that would make ohmic contact, such as gold. Metal layer 26 is also preferably formed of gold. The polymers forming the two polymer layers 20 and 24 are chosen so that these two polymers have opposite conductivities after irradiation. One polymer should have p conductivity, and the other polymer should have n conductivity. For example, polyphenylene sulfide (PPS) has p conductivity. If PPS is used as layer 20, layer 24 should be formed from a polymer with n conductivity, such as polyacrylonitrile (PAN). Conversely, if PAN is used as layer 20, PPS or another p conductivity polymer should be used for layer 24.

Figure 3A:
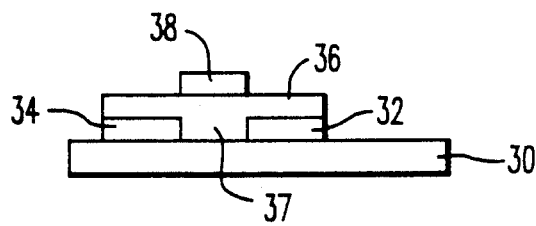
FIGS. 3A and 3B are diagrammatic representations of different types of FETS fabricated from the conductive polymers of the present invention.
Figure 3B:
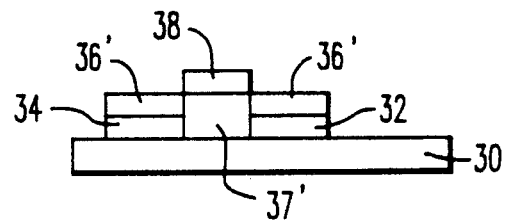

FIGS. 3A and 3B illustrate the equivalent of a metal-semiconductor a field effect transistor or MESFET formed using the ion irradiated conductive polymers of the present invention. In this device a substrate 30 formed of an insulator material carries two metal sections 32, 34 that form source and drain contacts. A conductive polymer layer 36 is deposited over the metal sections so that the polymer extends between metal sections as at 37 to contact the insulator 30. A second metal layer 38 is positioned on top of the polymer layer, forming a Schottky barrier to the polymer. The metal layers are preferably gold, and the polymer can be any polymer made highly conductive by the present process.

FIG. 3B illustrates a variation of FIG. 3A. The polymer layer 36 of FIG. 3a has a first type of conductivity. Irradiation of the MESFET of FIG. 3A by ion irradiation as described above converts the polymer to a second conductivity type in sections 36. However, the metal layer 38 masks section 37' so that the conductivity of the polymer in 37' remains unchanged by the ion irradiation. Metal sections 32 and 34 forming the source and drain contacts are self-aligned to the gate electrode to produce an enhancement mode transistor.

A further variation of the structure shown in FIG. 3B could be achieved by highly doping the polymer with a suitable dopant in sections 36' and lightly doping it in section 37'. Irradiation of this structure by ion irradiation then produces a MESFET which is highly conductive in highly doped sections 36', but only weakly conductive in section 37'. This device will function as a self-aligned enhancement or depletion mode transistor.

Figure 4A:
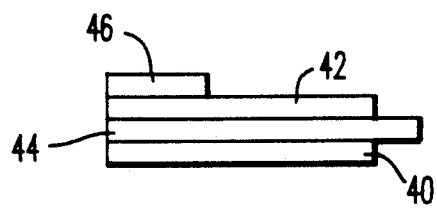
FIGS. 4A and 4B are diagrammatic representations of n/p/n junctions employing the conductive polymers of the present invention.
Figure 4B:
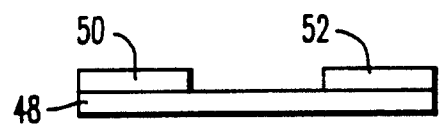

FIGS. 4A and 4B illustrate two different types of n/p/n junctions. Each employs two different polymers having opposite conductivity upon irradiation. FIG. 4A shows an n/p/n junction made with three polymer layers. Two outer layers 40 and 42 formed of a first polymer cover a central layer 44 of a second polymer. A metal layer 46 provides ohmic contact for the junction. The first and second polymers should be chosen to have opposite conductivity when irradiated. Therefore, the polymer layers 40 and 42 could be formed of polyacylonitrile (PAN), which has n conductivity after irradiation, and polymer layer 44 could be formed of polyphenylene sulfide (PPS), which has p conductivity after irradiation. The metal layer 46 could be formed of gold or another metal that would function similarly.

FIG. 4B represents another variation of heterojunction with an n/p/n configuration. Instead of the three polymer layers implanted to form the junction shown in FIG. 4A, two polymer layers are implanted as illustrated. A single continuous polymer layer 48 supports separated polymer layer segments 50 and 52 to produce the n/p/n junction. Layer 48 is preferably formed of a polymer such as PPS that has p conductivity when irradiated and polymer layer segments 50 and 52 are preferably formed of a polymer such as PAN that has n conductivity when irradiated. Conversely, a p/n/p junction could also be formed by reversing the polymers in layer 48 and layer segments 50 and 52.

Figure 5A:
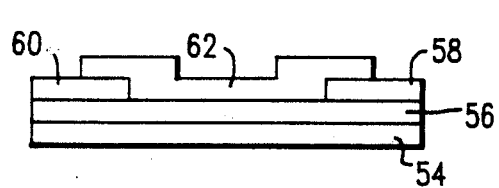
FIGS. 5A and 5B are diagrammatic representations of two types of equivalents of a MOSFET fabricated from polymers according to the present invention.
Figure 5B:
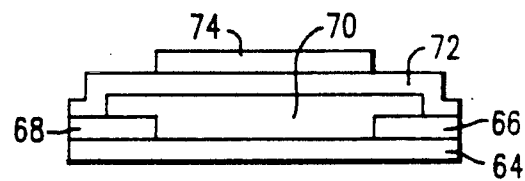

FIGS. 5A and 5B illustrate devices made from conductive polymers as described herein which are equivalent to metal oxide-semiconductor field effect transistors (MOSFETs). In FIG. 5A, layer 54 is made of a metal or another conductor and forms a gate electrode. Layer 56 is an insulating layer and forms a gate dielectrode. Sections 58 and 60 are made of metal or another suitable conductor and function as source and drain contacts. Section 62, which contacts both metallic sections 58 and 60 and insulator 56, is formed from a conductive polymer produced according to the present invention.

FIG. 5B illustrates another device equivalent to a MOSFET and is essentially the inverse of FIG. 5A. Layer 64 is an insulating substrate. Sections 66 and 68 are metal source and drain contacts, and section 70 is formed from a conductive polymer produced as described above. Layer 72 is a gate dielectrode formed from insulating material, and 74 is a metal gate electrode.

Figure 6:
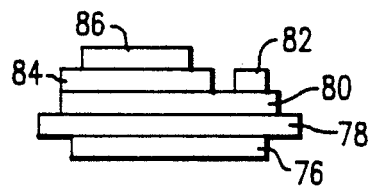
FIG. 6 is a diagrammatic representation of another type of electronic junction formed with conductive polymers according to the present invention.

FIG. 6 illustrates a microelectronic junction device employing polymers with two different types of conductivity. Layer 76 is formed of metal and forms a contact with layer 78, which is formed of a conductive polymer having a first type of conductivity. Layer 80 is formed of a conductive polymer having a second type of conductivity different from that of layer 78. Section 82 is formed of metal and functions as a contact for the polymer in layer 80. Section 84 is formed from a polymer having the same type of conductivity as that of the polymer in layer 78, and section 86 is a metal contact for the polymer in section 84.

Figure 7:
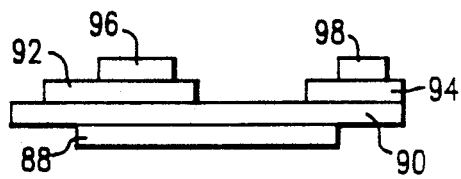
FIG. 7 is a diagrammatic representation of still another type of electronic junction formed with conductive polymers according to the present invention.

FIG. 7 illustrates another type of microelectronic device made from two different types of conductive polymers. Layer 88 is a metal contact for polymer layer 90, which has a first conductivity type. Sections 92 and 94 are formed of polymers having a second conductivity type, and sections 96 and 98 are the metal contacts for these conductive polymer sections.

Figure 8A:
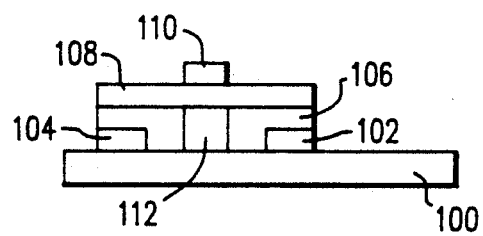
FIGS. 8A and 8B are diagrammatic representations of enhancement mode MOSFETs fabricated with the conductive polymers of the present invention.
Figure 8B:
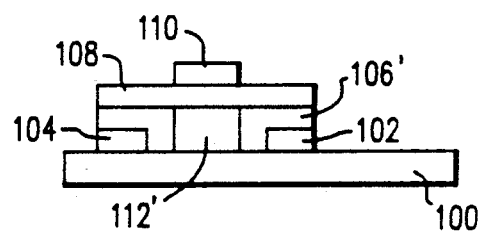

FIGS. 8A and 8B illustrate further variations of conductive polymer equivalents of MOSFETs. FIG. 8A represents a self-aligned enhancement mode MOSFET. Layer 100 is an insulator, and sections 102 and 104 are metal contacts for a conductive polymer section 106. Layer 108 is another insulating layer, and section 110 is a metal. The irradiation by ion irradiation of this device after assembly creates a polymer section 112 where the metal section 110 has masked this part of the polymer. The resulting MOSFET includes polymer sections with two types of conductivity. The conductivity of unmasked section 106 is different from the conductivity of masked section 112.

FIG. 8B illustrates a variation of the MOSFET of FIG. 8A and represents a self-aligned enhancement or depletion mode MOSFET. The differences between the structure of FIG. 8B and that of 8A are created by highly doping polymer section 106' and lightly doping section 112' prior to assembly. After assembly, the device is subjected to ion irradiation which results in unmasked polymer section 106' being highly conductive and masked polymer section 112' being only weakly conductive.

Figure 9:
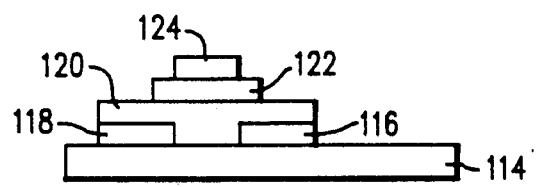
FIG. 9 is a diagrammatic representation of a JFET made of conductive polymers formed according to the present invention.

FIG. 9 illustrates yet another microelectronic junction device that may be constructed with the conductive polymers of the present invention. This device is a junction field effect transistor (JFET). Layer 114 is an insulator, and metal sections 116 and 118 form source and drain contacts. Irregularly shaped polymer layer 120 has a first conductivity type, and polymer layer 122 has a second conductivity type. Metal layer 124 provides a contact for polymer layer 122. Reverse biasing the p-n junction between polymer layers 120 and 122 creates a depletion region in polymer layer 120, which turns the transistor off.

The foregoing microelectronic junction devices are merely illustrative of some of the possible end use applications and junction configurations that can be achieved with the highly conductive ion irradiated polymers of the present invention. Polymers can be ion irradiated according to the processes described herein to produce polymer films for these applications that have a single type of conductivity (n or p) or that have both n and p conductivity. These novel polymers may be used in place of conventional materials in any end use application in which simple preparation, low cost, light weight, flexibility, radiation hardness, ease of fabrication and stable behavior are desired.

We claim:

1. A process for producing a highly conductive, conductively stable polymer, comprising the steps of:
   a. doping selected regions of the polymer with a chemical dopant to give said regions a first conductivity type; and
   b. irradiating both the selected region and other regions of said polymer with ions having an energy level high enough to simultaneously stabilize the dopant in the selected regions of the polymer without changing the conductivity type of the chemically doped regions and give the other regions of the polymer a second conductivity type opposite in charge to said first conductivity type,
   wherein oxygen-caused deterioration of said selected doped regions is prevented between said doping step (a) and said irradiating step (b).

2. The process of claim 1, wherein said ions are produced by an ion beam accelerator and the energy level of said irradiating ions is determined by the value of the total amount of energy per mass of said ions per area that said ions irradiate.

3. The process of claim 2, wherein dE/dx has a value of at least 100 KeV/mg/cm$^2$ for ions having an atomic weight equal to or greater than the atomic weight of fluorine.

4. The process of claim 3, further including the step of applying a photoresist layer over the selected regions of said polymer prior to step (b).

5. The process of claim 4, wherein said photoresist layer is formed from a compound selected from the group consisting of polymethylmethacrylate, platinum boron sulfide, polyvinyl chloride, polymethylvinyl ketone and polyvinyl alcohol.

6. The process of claim 1, wherein said polymer is selected from the group consisting of polypyrrole, polythiophene, polyaniline, polyethylene, polyacrylonitrile, polyphenylene sulfide, polyacetylene, polyimide, and polyamide-imide.

7. The process of claim 6, wherein said dopant is selected from the group consisting of fluorine, bromine, iodine, arsenic pentafluoride, ferric chloride, sulfur trioxide, dicyanodichloro-p-benzoquinone, sodium, potassium and lithium.

8. The process of claim 7, wherein said polymer is polyacetylene, said chemical dopant is iodine, and said irradiating ions are iodine ions.

9. A process for producing a high conductive, conductively stable polymer wherein, in an atmosphere free from oxygen, selection regions of a film of polyacetylene are chemically doped with iodine, to give these regions p-type conductivity, and the doped polyacetylene film is introduced into the vacuum of an ion accelerator beam and irradiated with a does of high energy ions sufficient to stabilize the p-conductive regions without changing the conductivity type of the chemically doped regions while rendering the other regions of the polymer n-conductive.

10. The process of claim 9, wherein said high energy ions comprise 50 MeV iodine ions.

11. The process of claim 10, wherein said high energy ion dose is $5 \times 10^{13}/cm^2$.

12. The process of claim 11, wherein said high energy ion dose is $1.1 \times 10^{14}/cm^2$.

13. The process of claim 1, further including the steps of, prior to step a, applying a first mask to the polymer to define regions of the polymer to be chemically doped to produce said first conductivity type; after step a, but prior to step b, applying a second mask to the doped polymer to define nonconductive, insulation regions and regions to have a second conductivity type and coating said defined regions with a coating sufficiently thick to inhibit the passage of the ions therethrough.

14. The process of claim 13, wherein said coating has a thickness within the range of about 5 to about 20 microns.

15. The process of claim 1, further including the steps, of prior to step a, coating the polymer with a resist coating to define regions on the polymer to have a first type of conductivity in the conductive polymer and irradiating the said defined regions with a high energy electron beam to produce said first type of conductivity; selecting said dopant to produce a second type of conductivity opposite said first type of conductivity on said polymer; irradiating the doped polymer according to step b with ions having lower energy than the ions used to irradiate said defined regions; and, after step b, exposing said irradiated polymer to ambient air.

16. The process of claim 1, further including the steps of, prior to step a, applying a first mask to said polymer to define regions having a first conductivity type and, after step a but prior to step b, depositing a thin coating of etchable material over said defined regions, applying a second mask defining nonconductive regions on said polymer and coating said nonconductive regions with a coating impenetrable to said ions; and, after step b, etching said coatings from said polymer.

17. The process of claim 1, further including the steps of, after step a and prior to step b, applying a mask to said polymer to cover regions of the polymer having said first conductivity type, coating the remaining regions of the polymer with a thick layer of an etchable material, irradiating the coated polymer with ions, removing the etchable material, exposing said polymer to the ambient air, applying a mask to said polymer to expose said regions having said first conductivity type and to define insulation regions, covering said exposed regions and defined insulation regions with a thick layer of an etchable coating; and, after step b, removing said etchable coating.

18. The process of claim 15, further including the steps of, just prior to step b, depositing a thin layer of metal on said doped polymer.

19. A microelectronic junction including a conductive polymer film produced according to claim 1 interposed between a layer of a first metal and a layer of a second metal.

20. A microelectronic junction including a conductive polymer film produced according to the process of claim 1, wherein said polymer film is configured to simultaneously conductively contact a first metal, a second metal and an insulator.

21. A microelectronic junction including first and second conductive polymer films, each produced according to the process of claim 1, wherein said first polymer has a type of conductivity different from said second polymer.

22. The microelectric junction described in claim 19, wherein said first metal is gold and said second metal is selected from the group consisting of aluminum and indium.

23. The microelectronic junction described in claim 21, wherein said junction includes a central section comprised of a layer of said first polymer and a layer of said second polymer, a first outer section comprised of a first metal, and a second outer section comprised of a second metal.

24. The microelectric junction described in claim 23 wherein said first polymer is polyphenylene sulfide, said second polymer is polyacrylonitrile and said first and second metals are gold.

25. The microelectronic junction described in claim 21, wherein said junction includes a central layer of said second polymer laminated between two outer layers of said first polymer and a metal portion conductively contacting one of said outer layers of said first polymer.

26. The microelectronic junction device described in claim 25, wherein said first polymer is polyacrylonitrite, and said second polymer is polyphenylene sulfide.

27. The microelectronic junction described in claim 21, wherein said junction includes a continuous layer of said second polymer and a discontinuous layer of said first polymer.

28. The microelectronic junction device described in claim 27, wherein said first polymer is polyacrylonitrile and said second polymer is polyphenylene sulfide.

29. The microelectronic junction described in claim 21, wherein said first polymer comprises polyacrylonitrile and said second polymer comprises polyphenylene sulfide.

30. A process for producing a conductive and conductively stable polymer having both N and P conductive regions, comprising the step of:
   a. doping a first selected region of said polymer to give said region a first conductivity type and irradiating a second selected region of said polymer with ions of a first energy level to give said first selected region a first stable conductivity type, and
   b. irradiating a second selected region of said polymer with ions of a second energy level higher than said first energy level to give said second selected region a second stable conductivity type.

31. A process for producing a conductive and conductively stable polymer as defined in claim 30, further including the step of coating only said first selected region with a photoresist layer so that when said first selected region is irradiated with ions of said second energy level, the energy level of ions penetrating said photoresist layer is reduced to said first energy level.

* * * * *